(12) United States Patent
Oh et al.

(10) Patent No.: US 6,389,563 B1
(45) Date of Patent: May 14, 2002

(54) SEMICONDUCTOR MEMORY TEST CIRCUIT AND METHOD FOR THE SAME

(75) Inventors: Jin Keun Oh; Young Hee Kim, both of Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/340,731

(22) Filed: Jun. 29, 1999

(30) Foreign Application Priority Data

Jun. 29, 1998 (KR) ............................................. 98-24825
Jun. 29, 1998 (KR) ............................................. 98-24827

(51) Int. Cl.[7] ............................................. G11C 29/00
(52) U.S. Cl. ........................................ 714/718; 365/207
(58) Field of Search ................................ 714/718, 724; 365/201, 222

(56) References Cited

U.S. PATENT DOCUMENTS

| | | | |
|---|---|---|---|
| 5,365,487 A | * 11/1994 | Patel et al. .................. | 365/226 |
| 5,416,741 A | * 5/1995 | Ohsawa ....................... | 365/201 |
| 5,511,029 A | 4/1996 | Sawada et al. .............. | 365/201 |
| 5,587,950 A | 12/1996 | Sawada et al. .............. | 365/201 |
| 5,867,439 A | 2/1999 | Asakura et al. ............. | 365/222 |

OTHER PUBLICATIONS

Konishi et al., A 38–ns 4–Mb DRAM with a Battery Backup mode, IEEE, p. 1112–1117, Oct. 1990.*

* cited by examiner

Primary Examiner—Albert Decady
Assistant Examiner—Shelly A Chase
(74) Attorney, Agent, or Firm—Jacobson Holman, PLLC

(57) ABSTRACT

A semiconductor memory test circuit and a method for the same to reduce the test time in testing a semiconductor memory. The semiconductor memory test circuit includes: a parallel test circuit for performing a parallel test when inputting a battery backup signal (bbu), a column address signal (cas5), a CAS before RAS signal (cbr), a write enable signal (ew), a power-up bar signal (pwrupb), and a row address signal (ras71)); and a test mode circuit which is controlled by a combination of a parallel test signal (pt) and the battery backup signal (bbu) generated from the parallel test circuit, and generates a test time reduction signal (ttrb), whereby the semiconductor memory test circuit compresses one least significant bit indicating a row address of a device in the case of a 4K refresh operation when the test time reduction signal (ttrb) is enabled, and compresses two least significant bits indicating a row address of a device in the case of an 8K refresh operation when the test time reduction signal (ttrb) is enabled.

13 Claims, 5 Drawing Sheets

SEMICONDUCTOR MEMORY TEST CIRCUIT AND METHOD FOR THE SAME

BACKGROUND OF THE INVENTION

1. Field of the Invention

The present invention relates to a semiconductor memory test circuit and a method for the same. More particularly, it relates to a semiconductor memory test circuit and a method for the same which reduce the test time in testing a semiconductor memory.

2. Description of the Prior Art

Generally, to determine whether cells of a manufactured memory chip are a in Pass state or a in Fail state, assuming that the testing of every one cell is performed in a semiconductor memory, it takes a great deal of time to test a high-integration device, and the test cost increases. Accordingly, a parallel test has been used to reduce the test time.

The parallel test (pt) writes the same data to a plurality of cells and uses an exclusive OR circuit in a reading operation, thereby determining a Pass state "1" when the same data are read by the exclusive OR circuit, or a Pail state "0" when different data is read by the exclusive OR circuit.

A 3RD 64M Extended Data Out Dynamic Random Access Memory (EDO DRAM) performs a parallel test (pt) of 2M×32Bit. For a parallel test of over 2M×32Bit, the 64M EDO DRAM should consider a chip size according to an increase of a read/write data (RWD) line, thus the parallel test over 32Bit is not considered in the 64M EDO DRAM.

Here, unlike a parallel test performing a write/read operation by generally using only two input/output pads, the 3RD 64M EDO DRAM performs, as to a principle of the parallel test, a parallel test by using the same input/output pad as a normal operation as shown in the following TABLE 1, according to each construction.

TABLE 1

|     | NORMAL operation | Parallel Test |
| --- | --- | --- |
| X4  | I/O 0, 4, 11, 15 | I/O 0, 4, 11, 15 |
| X8  | I/O 0,2,4,6,9,11,13,15 | I/O 0,2,4,6,9,11,13,15 |
| X16 | I/O 0–I/O 15 | I/O 0–I/O 15 |

The parallel test is started by enabling a signal "pt" by a WCBR(/WE, /CAS Before /RAS) refresh, and exits by disabling a signal "pt" by CBR(/CAS Before /RAS) refresh or ROR(/RAS only Refresh).

If the signal "pt" is enabled from the WCBR mode, an address combination for driving a cell of 2M×32Bit by the signal "pt" is achieved from a Y-address buffer, has no correlation with each construction (x4/, x8/, x16), and is different in a 4K refresh or an 8K refresh.

In the case of an 8K refresh, the X-address ranges from X0 to X12 because of $8K=2^{13}$, and addresses (Y8, Y9, Y10, Y11) among a plurality of Y-addresses are compressed by the signal "pt"; thus the Y-address actually driving the Y-decoder ranges from Y0 to Y7.

In the case of a write operation, 32 data per one operation are loaded on a read/write data (RWD) line and are recorded on 32 cells.

In the case of a reading operation, one word line and one Y-input (Yi) per 8M block are enabled in one operation so that data of 4 cells are accessed to a global database (DB) line via 4-bit line pairs and are loaded on 32 RWD lines.

The Pass or Fail state of the data loaded on 32 RWD lines is determined by an exclusive OR circuit positioned to each pad, and the data loaded on 32 RWD lines are output to an I/O pad proper to each construction such as x4/,x8/,x6.

In the case of a 4K refresh, the X-address ranges from X0 to X11 because of $4K=2^{12}$ as well as a previously compressed X12 address, addresses (Y8, Y9, Y10, Y11) among a plurality of Y-addresses are compressed by the signal "pt", and the following operation is the same as an 8K refresh.

In the parallel test, a write/read operation is achieved through two I/O pads, regardless of each construction such as x4/, x8/, x16, but this 3RD 64M EDO DRAM performs a parallel test through the same I/O pad as the construction. Also, in a reading operation, 32 data are not simultaneously compared by an exclusive OR circuit; only two data belonging to each I/O pad are logically compared by the exclusive OR circuit so that the 3RD 64M EDO DRAM can be tested by writing different data on each I/O pad.

Such a parallel test is shown in the following Table 2.

TABLE 2

|  |  | 4 Mb × 16 | 8 Mb × 8 | 16 Mb × 4 |
| --- | --- | --- | --- | --- |
| 8 K Refresh | | X0–X12 (X0–X7:256 Row, X8–X12:256 K Block) Y0–Y8 (Y0–Y7:256 Yi, Y8–Y9:4 GDB, Y10–Y11:8 M Block) | X0–X12 (X0–X7:256 Row, X8–X12:256 K Block) Y0–Y9 (Y0–Y7:256 Yi, Y8–Y9:4 GDB, Y10–Y11:8 M Block) | X0–X12 (X0–X7:256 Row, X8–X12:256 K Block) Y0–Y10 (Y0–Y7:256 Yi, Y8–Y9:4 GDB, Y10–Y11:8 M Block) |
| 4 K Refresh | | X0–X11 (X0–X7:256 Row, X8–X11:256 K Block) Y0–Y9 (Y0–Y7:256 Yi, Y8–Y9:4 GDB, Y10–Y11:8 M Block) | X0–X11 (X0–X7:256 Row, X8–X11:256 K Block) Y0–Y10 (Y0–Y7:256 Yi, Y8–Y9:4 GDB, Y10–Y11:8 M Block) | X0–X11 (X0–X7:256 Row, X8–X11:256 K Block) Y0–Y11 (Y0–Y7:256 Yi, Y8–Y9:4 GDB, Y10–Y11:8 M Block) |

The parallel test (pt) such as that in the above Table 2 is made by reducing the number of column addresses in order to drive a manufactured product with x32Bit. By doubling the activation of a column address, the test speed proportionally doubles.

In the meantime, as the generation of a high-integration semiconductor memory device increases, the number of cells increases four times.

As a result, the test time also increases four times, thereby increasing the test time as well as the test cost.

For example, in case of a 64M DRAM, its test time is about four times of that of a 16M DRAM and 16 times of that of a 4M DRAM, and its test cost is also increased.

Assuming that 128M, 256M, and 1G DRAMs are manufactured in the future, the test time and the test cost will further increase.

In particular, in the case of a long-cycle disturbance test, it takes 64 msec per one cycle in an 8K refresh so that a test time of over 64 msec×8K Row=512sec (i.e., 8 minutes and 32 seconds) is needed.

Also, in the case of a 4K refresh, it takes 64 msec per cycle, so that a test time of over 64 msec×4K Row=256 sec (i.e., 4 minutes and 16 seconds) is needed.

In other words, since a test time of about 4–8 minutes per device is needed, the test time and the test cost will be continually increase in the mass-production of the devices.

SUMMARY OF THE INVENTION

Accordingly, the present invention is directed to a semiconductor memory test circuit and a method for the same that substantially obviate one or more of the problems due to the limitations and disadvantages of the related art.

It is an objective of the present invention to provide a semiconductor memory test circuit and a method for the same which achieve a new function by using a conventional parallel test signal, and to apply a test time reduction scheme to a long cycle disturbance test in a package test in order to correspond to an increasing test cost as the generation of devices increases in a high-integration semiconductor memory, thereby reducing the test time of a semiconductor memory device.

To achieve the above objective, a semiconductor memory test circuit includes a parallel test circuit for performing a parallel test when inputting a battery backup signal (bbu), a column address signal (cas5), a CAS before RAS signal (cbr), a write enable signal (ew), a power-up bar signal (pwrupb), and a row address signal (ras71); and a test mode circuit which is controlled by a combination between a parallel test signal (pt) and the battery backup signal (bbu) generated from the parallel test circuit and generates a test time reduction signal (ttrb), whereby the semiconductor memory test circuit compresses one least significant bit indicating a row address of a device in the case of a 4K refresh operation when the test time reduction signal (ttrb) is enabled, and compresses two least significant bits indicating a row address of a device in the case of an 8K refresh operation when the test time reduction signal (ttrb) is enabled.

A semiconductor memory test method includes the step of controlling a test time reduction signal (ttrb) by a combination of a parallel test signal (pt) and a battery backup signal (bbu), wherein the test time reduction signal (ttrb) compresses one least significant bit indicating a row address of a device performing a 4K refresh operation in the case of a 4K refresh operation, and compresses the two least significant bits indicating a row address of a device performing an 8K refresh operation in the case of an 8K refresh operation.

The parallel test circuit includes a high voltage generator for generating a high voltage by buffering an input signal; a RAS only refresh detector for generating a RAS only refresh signal by detecting an input RAS signal or an input CAS signal; and a parallel test signal generator for generating a parallel test signal by both the high voltage signal from the high voltage generator and the RAS only refresh signal from the RAS only refresh detector.

The test mode circuit includes a NAND gate which receives a parallel test signal and the battery backup signal generated from the parallel test circuit as an input and performs a NAND operation about them; a NAND gate latch which receives an output signal of the NAND gate and the parallel test signal as an input and generates a signal of "0" when the output signal of the NAND gate and the parallel test signal are "1"; and a buffer for buffering an output signal of the NAND gate latch.

Additional features and advantages of the invention will be set forth in the description which follows, and in part will be apparent from the description, or may be learned by practice of the invention. The objective and other advantages of the invention will be realized and attained by the structure particularly indicated in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objectives and advantages of the present invention will become apparent from the following description in conjunction with the attached drawings in which.

DETAILED DESCRIPTION OF THE PREFERRED EMBODIMENT

A preferred embodiment of the present invention will now be described in detail with reference to the accompanying drawings.

Figure 1:
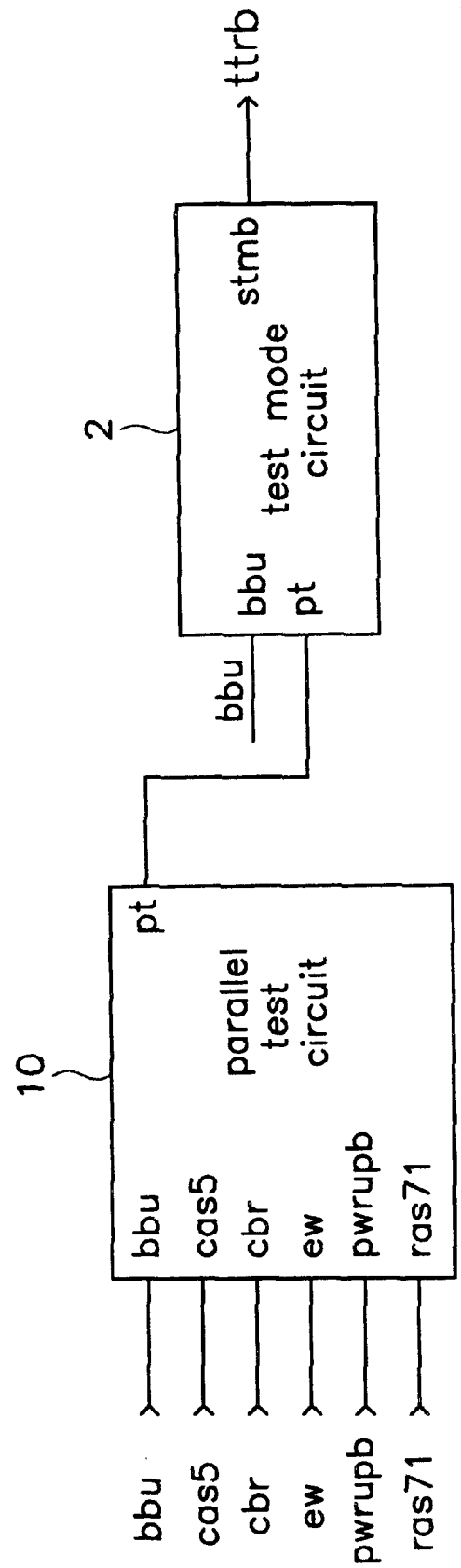
FIG. 1 illustrates a block diagram of a semiconductor memory test circuit according to the present invention.
Figure 2:
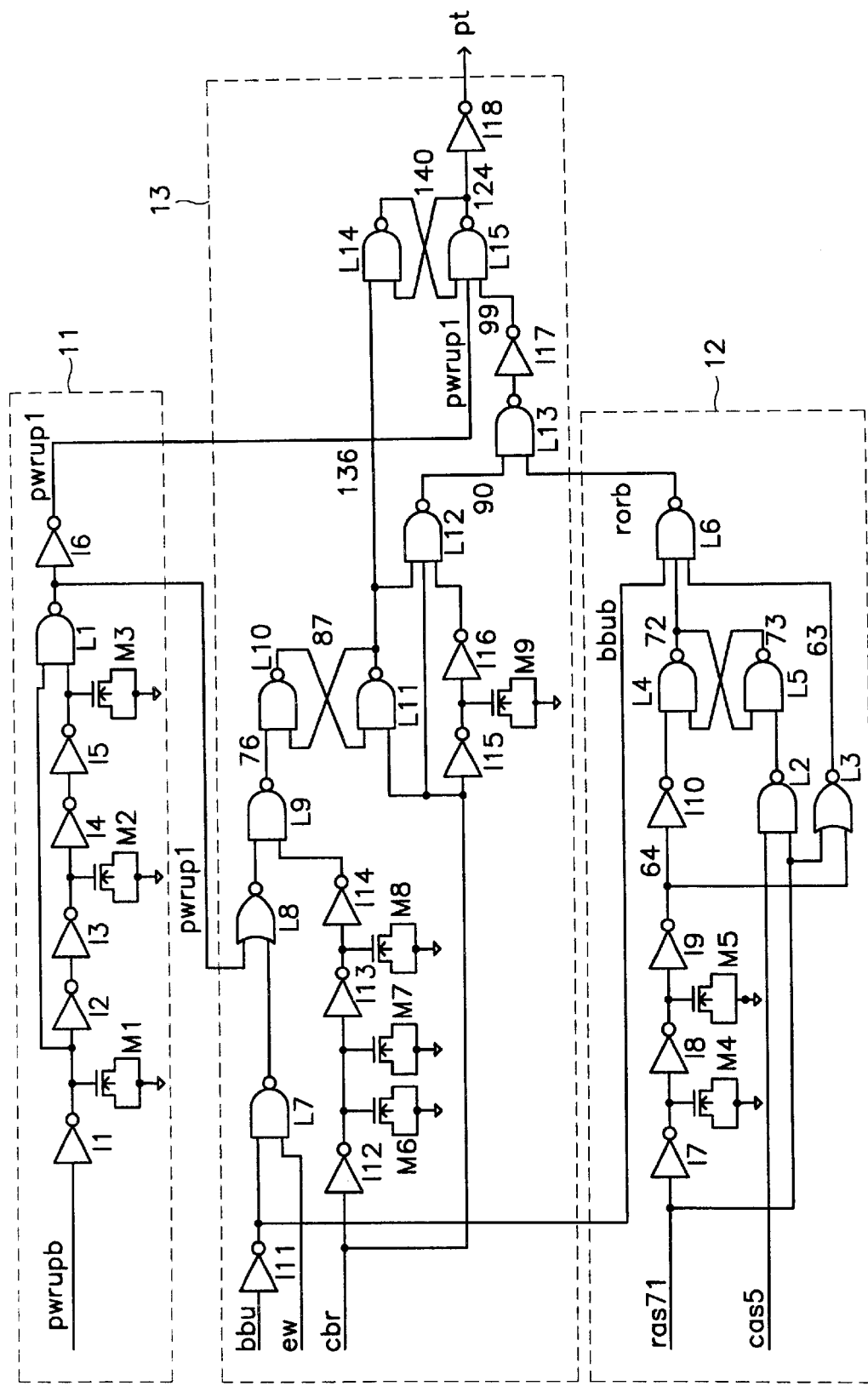
FIG. 2 illustrates an internal circuit diagram of a parallel test circuit shown in FIG. 1.
Figure 3:
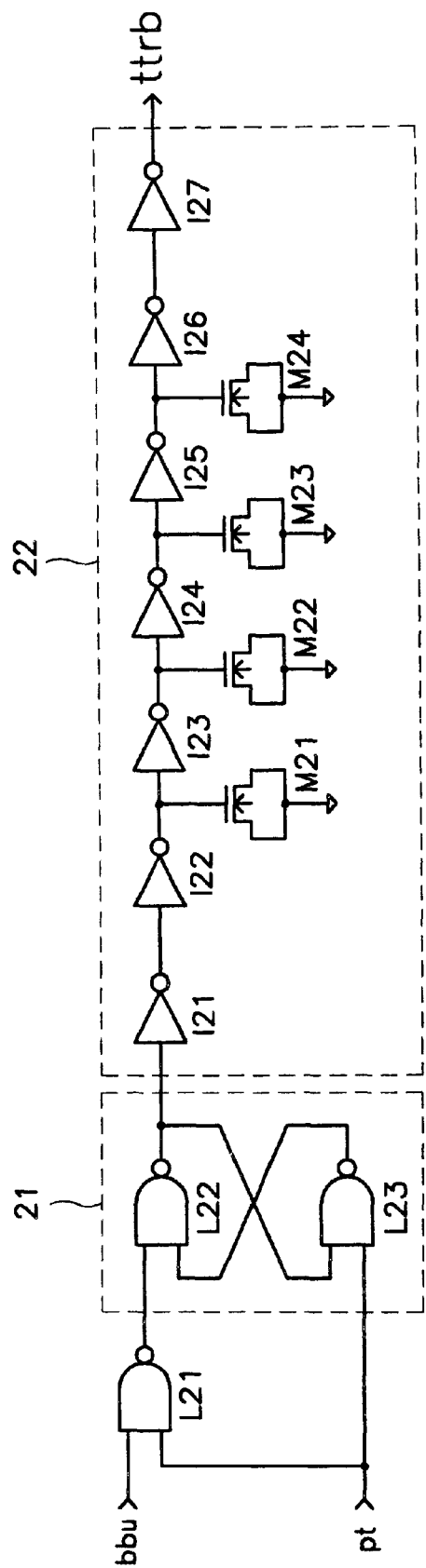
FIG. 3 illustrates an internal circuit diagram of a test mode circuit shown in FIG. 1.

FIG. 1 illustrates a block diagram of a semiconductor memory test circuit according to the present invention, FIG. 2 illustrates an internal circuit diagram of a parallel test circuit shown in FIG. 1, and FIG. 3 illustrates an internal circuit diagram of a test mode circuit shown in FIG. 1.

As shown in FIG. 2, the parallel test circuit 10 includes a high voltage generator 11 for generating a high voltage by buffering an input signal; a RAS only refresh detector 12 for generating a RAS only refresh signal by detecting an input RAS signal or an input CAS signal; and a parallel test signal generator 13 for generating a parallel test signal by both the high voltage signal from the high voltage generator 11 and the RAS only refresh signal from the RAS only refresh detector 12.

As shown in FIG. 3, the test mode circuit 20 includes a NAND gate L21 which receives a parallel test signal and the battery backup signal generated from the parallel test circuit 10 as an input and performs a NAND operation about them; a NAND gate latch 21 which receives an output signal of the NAND gate L21 and the parallel test signal as an input and generates a signal of "0" when the output signal of the NAND gate L21 and the parallel test signal are "1"; and a buffer 22 for buffering an output signal of the NAND gate latch 21.

The test mode circuit 10 performs a special function after a predetermined time after entering a WCBR (/WE, /CAS Before /RAS) refresh. In the prior art, a parallel test signal (pt) is entered in a test mode after a predetermined time.

After the predetermined time after entering the WCBR refresh, more precisely, after a time of 128 us over, a battery backup signal (bbu) is entered, and then a test time reduction signal (ttrb) is made by a combination of the parallel test signal (pt) and the battery backup signal (bbu).

The test time reduction signal (ttrb) is disabled when the parallel test signal (pt) is disabled or is disabled in case of either CBR (/CAS Before /RAS) refresh or ROR (/RAS only Refresh).

Hereinafter, operations of the parallel test mode circuit 10 will now be described in detail.

Firstly, a case that the test time reduction signal (ttrb) is enabled after a predetermined time after entering a WCBR refresh in a parallel test circuit 10 will be described with reference to FIG. 4.

Figure 4:
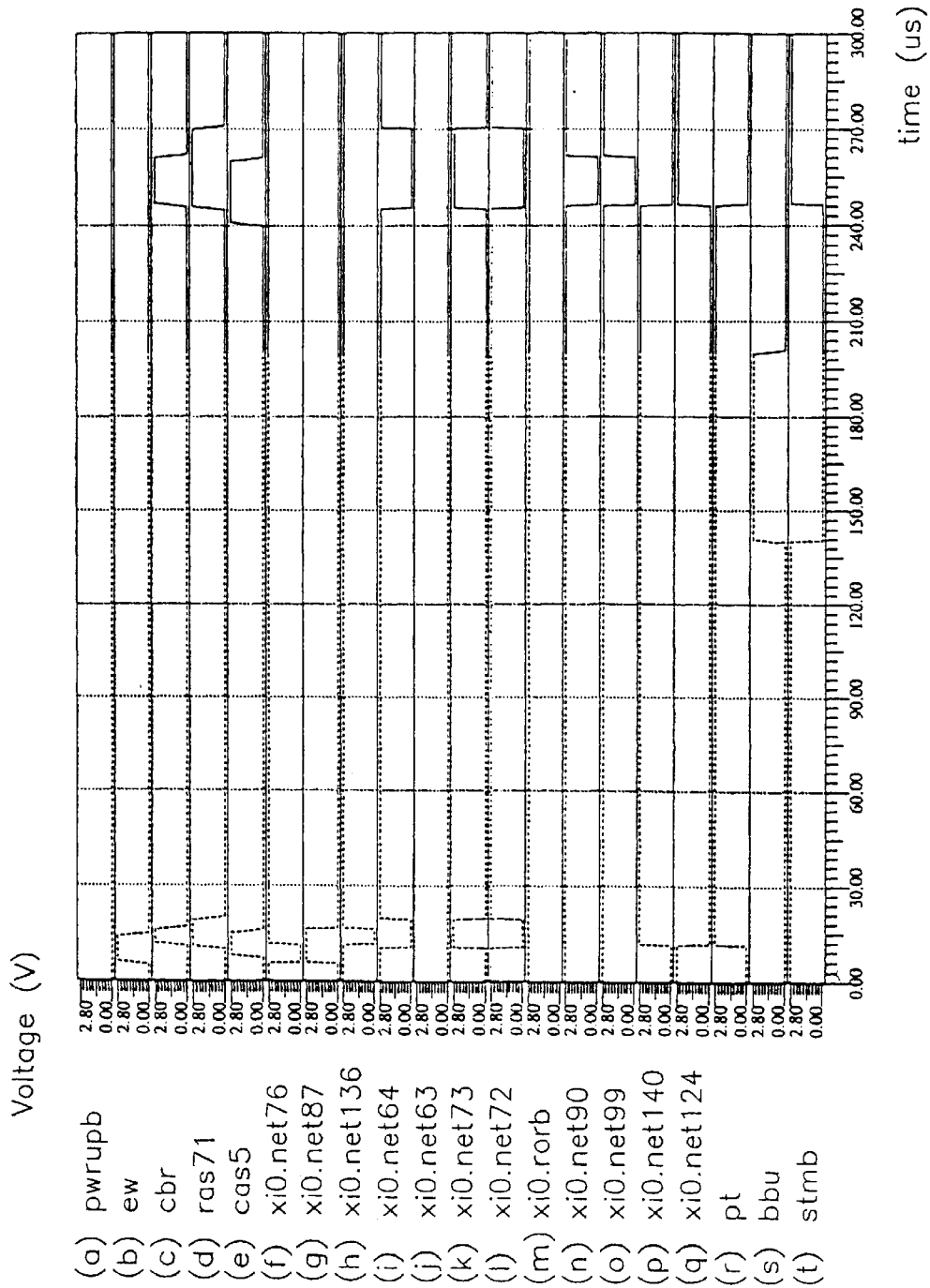
FIG. 4 illustrates an input/output timing chart when the test mode circuit of FIG. 3 is enabled and a parallel test signal (pt) is disabled by a CBR (/CAS before /RAS) refresh.

FIG. 4 illustrates an input/output timing chart when the test mode circuit of FIG. 3 is enabled and a parallel test signal (pt) is disabled by a CBR (/CAS before /RAS) refresh.

In case of a WCBR refresh, in a RAS only refresh detector 12 of a parallel test circuit 10 shown in FIG. 2, a column address signal (cas5) shown in FIG. 4(e) and a write enable signal (ew) shown in FIG. 4(b) are first enabled prior to a row address signal (ras71) shown in FIG. 4(d), and a CAS before RAS signal (cbr) shown in FIG. 4(c) is thus enabled as a logic "HIGH".

Once the write enable signal (ew) is enabled as "HIGH", a battery backup signal(bbu) of a logic "LOW" is inverted by an inverter I11 of the parallel test signal generator 13 as shown in FIG. 4(s).

Since a battery backup bar signal (bbub) inverted by the inverter I11 is at a logic "HIGH" and the write enable signal (ew) is at a logic "HIGH", an output signal of NAND gate L7 becomes a logic "LOW" and is then input to one terminal of a NOR gate L8.

A power-up bar signal (pwrupb1) of logic "LOW" is input to the other terminal of the NOR gate L8 via inverters I1–I5 and a NAND gate L1 of the high voltage generator 11, so that an output signal of the NOR gate L8 becomes a logic "HIGH" and is then input to one terminal of NAND gate L9.

Since a logic "LOW" CAS before RAS signal (cbr) inverted by the inverters I12–I14 is input to the other terminal of the NAND gate L9, an output node 76 of the NAND gate L9 becomes a logic "LOW" as shown in FIG. 4(f) and is then input to NAND gate L10.

Therefore, an output signal of the NAND gate L10 changes to a logic "HIGH" on its output node 87 as shown in FIG. 4(g).

After that, once the CAS before RAS signal (cbr) is enabled as a logic "HIGH", as shown in FIG. 4(c), the node 76 becomes at a logic "HIGH" and the logic "HIGH" signal on the node 76 is input to the NAND gate L10. A node 136 becomes at a logic "LOW" as shown in FIG. 4(h) by a NAND gate L11 receiving the CAS before RAS signal (cbr) of logic "HIGH" as an input.

At this time, a logic "HIGH" signal is maintained at a node 87 which is an output node of the NAND gate L10.

In the meantime, since a node 136 is at a logic "LOW" by an output signal of the NAND gate L11, an output node 90 of NAND gate L12 becomes a logic "HIGH" as shown in FIG. 4(n), and an output node (rorb) of the RAS only refresh detector 12 continuously maintains a logic "HIGH" signal as shown in FIG.

By a logic "HIGH" signal of an output node 90 of the NAND gate L12 and a logic "HIGH" signal of an output node (rorb) of the RAS only refresh detector 12, a node 99 becomes a logic "HIGH" as shown in FIG. 4(o) through a NAND gate L13 and an inverter I17.

An output node 140 of NAND gate L14 receiving a logic "LOW" signal of the output node 136 of the NAND gate L11 is at a logic "HIGH" as shown in FIG. 4(p), an output node 124 of NAND gate L15 becomes a logic "LOW" as shown in FIG. 4(q), and a parallel test signal (pt) is enabled as a logic "HIGH" from a logic "LOW" through an inverter I18 as shown in FIG. 4(r).

Secondly, a case wherein the parallel test signal (pt) is disabled by a CBR (CAS before RAS) refresh will be described with reference to FIG. 4.

In this case, since a write enable signal (ew) is a logic "LOW" as shown in FIG. 4(b), there is no change in a plurality of nodes 76, 87, and 136 of a parallel test signal generator 13.

Accordingly, the output node 136 of the NAND gate L11 is at a logic "HIGH" as shown in FIG. 4(h) and the CAS before RAS signal (cbr) is at a logic "HIGH" as shown in FIG. 4(c) so that the output node 90 of the NAND gate L12 becomes a logic "LOW" signal as shown in FIG. 4(n).

As a result, since a node 99 becomes a logic "LOW" signal as shown in FIG. 4(o) through the NAND gate L13 and the inverter I17, a parallel test signal (pt) is disabled as a logic "LOW" from a logic "HIGH" as shown in FIG. 4(r).

Next, a case wherein the parallel test signal (pt) is disabled by a RAS only refresh (ROR) will be described with reference to FIG. 5.

Figure 5:
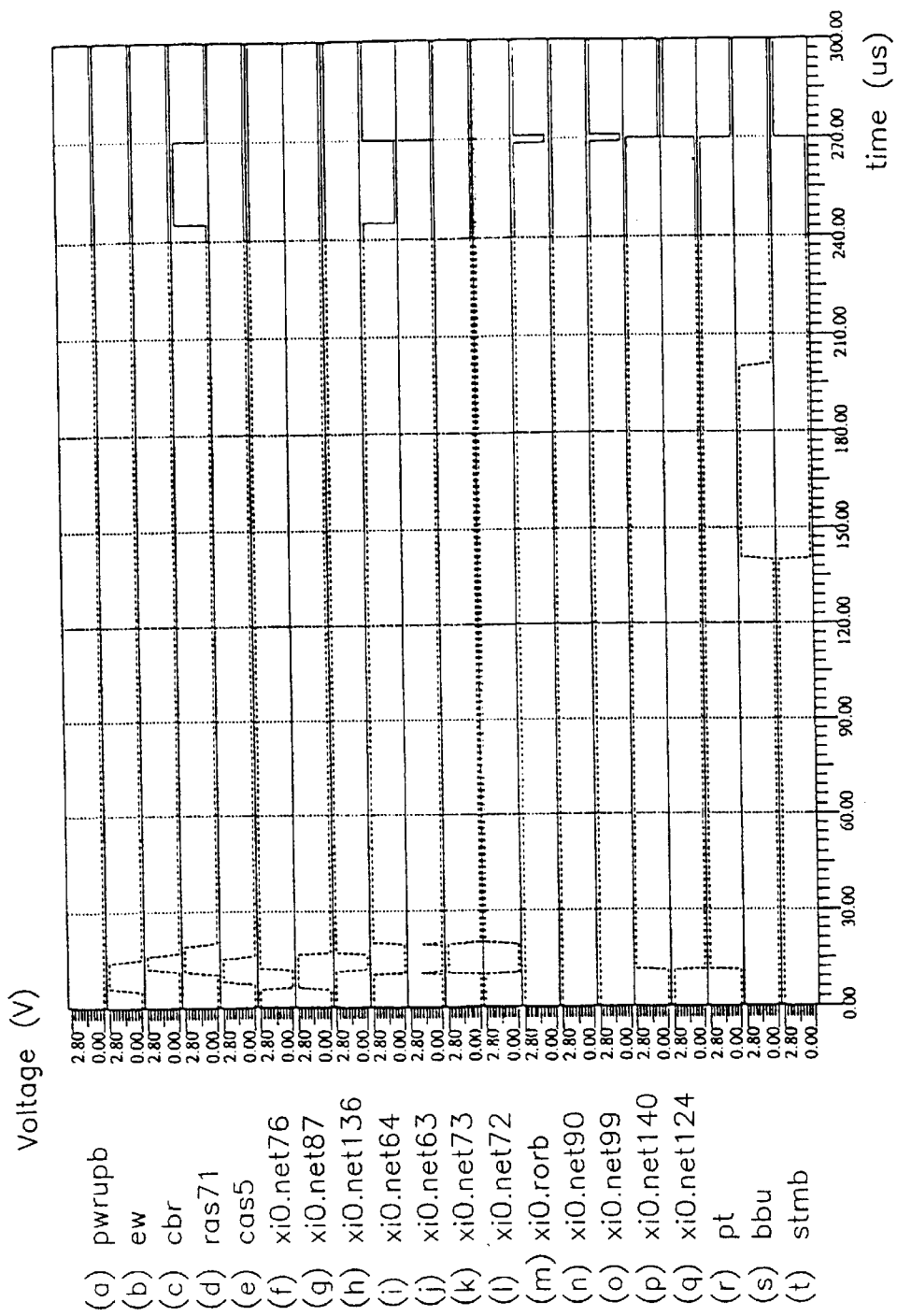
FIG. 5 illustrates an input/output timing chart when a parallel test signal (pt) is disabled by ROR (RAS only Refresh).

FIG. 5 illustrates an input/output timing chart when a parallel test signal (pt) is disabled by ROR (RAS only Refresh) according to the present invention.

A column address signal (cas5) is at a logic "LOW" state as shown in FIG. 5(e), a node 63 becomes a logic "HIGH" as shown in FIG. 5(j) when the row address signal (ras71) exits a PAS only refresh (ROR) from logic "HIGH" to logic "LOW" as shown in FIG. 5(d).

A battery backup bar signal (bbub) is at a logic "HIGH", and a node 72 is at a logic "HIGH" as shown in FIG. 5(l), so that a node (rorb) becomes a logic "LOW" as shown in FIG. 5(m) after passing the NAND gate L6.

Accordingly, the node 99 is disabled as a logic "LOW" as shown in FIG. 5(o), and the parallel test signal (pt) is disabled as a logic "LOW" from a logic "HIGH" as shown in FIG. 5(r).

Herein, operations of the test mode circuit 20 will be described in more detail with reference to FIG. 3.

A test time reduction signal (ttrb) is controlled by the parallel test signal (pt) and the battery backup signal (bbu).

After the parallel test signal (pt) is enabled as a logic "HIGH" as shown in FIG. 5(r), if the battery backup signal (bbu) is enabled as a logic "HIGH" as shown in FIG. 5(s) after a predetermined time (e.g., after a time of 128 us), an output signal of NAND gate L21 becomes a logic "LOW" and is then input to a NAND gate L22 of a NAND gate latch 21.

In the meantime, the parallel test signal (pt) enabled as a logic "HIGH" as shown in FIG. 5(r) is input to a NAND gate L23 of the NAND gate latch 21, so that an output signal of the NAND gate latch 21 becomes a logic "HIGH".

The logic "HIGH" signal being the output signal of the NAND gate latch 21 passes through a buffer 22, and the test time reduction signal (ttrb) is enabled as a logic "LOW" as shown in FIG. 5(t).

As described above, in the case of the test time reduction signal (ttrb) of a logic "LOW", four word lines are activated by compressing AX11 in a 4K refresh operation.

This means that the test time is reduced by about 50%.

Also, in an 8K refresh operation, four word lines are activated by compressing AX11 and AX12.

This means that the test time is reduced by about 75%.

On the contrary, after the parallel test signal (pt) is disabled as a logic "LOW" as shown in FIG. 5(r), if the battery backup signal (bbu) is enabled as a logic "HIGH" as shown in FIG. 5(s) after a predetermined time (e.g., after a time of 128 us), an output signal of the NAND gate L21 becomes a logic "HIGH" and is then input to a NAND gate L22 of the NAND gate latch 21.

The parallel test signal (pt) disabled as a logic "LOW" as shown in FIG. 5(r) is input to the NAND gate L23 of the NAND gate latch 21, so that an output signal of the NAND gate latch 21 becomes a logic "LOW".

As described above, the output signal of logic "LOW" of the NAND gate latch 21 passes through a buffer 22, a test time reduction signal (ttrb) is disabled as a logic "HIGH" as shown in FIG. 5(t).

Therefore, the test time reduction signal (ttrb) is enabled after elapsing a predetermined time (i.e., 128 us) after a WCBR refresh is enabled, and is disabled by a CBR (CAS before RAS) refresh or ROR (RAS only refresh).

As described above, in order to decrease the test time and the test cost which increase as the number of cells increases four times the amount of the increase in a device generation of a semiconductor memory, the present invention applies a test time reduction scheme to a long-cycle disturbance test, thereby reducing the test time by about 50%–75%.

In addition, the present invention can be applicable to a product's development by using the conventional parallel test timing.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor memory test circuit comprising:
    a parallel test circuit for performing a parallel test when inputting a battery backup signal, a column address signal, a CAS before RAS signal, a write enable signal, a power-up bar signal, and a row address signal; and
    a test mode circuit which is controlled by a combination of a parallel test signal and the battery backup signal generated from the parallel test circuit and generates a test time reduction signal,
    whereby the semiconductor memory test circuit compresses one least significant bit indicating a row address of a device in the case of a 4K refresh operation when the test time reduction signal is enabled, and compresses two least significant bits indicating a row address of a device in the case of 8K refresh operation when the test time reduction signal is enabled.

2. The semiconductor memory test circuit according to claim 1, wherein the parallel test circuit comprises:
    a high voltage generator for generating a high voltage by buffering an input signal;
    a RAS only refresh detector for generating a RAS only refresh signal by detecting an input RAS signal or an input CAS signal; and
    a parallel test signal generator for generating a parallel test signal by both the high voltage signal from the high voltage generator and the RAS only refresh signal from the RAS only refresh detector.

3. The semiconductor memory test circuit according to claim 1, wherein the test mode circuit comprises:
    a NAND gate which receives a parallel test signal and the battery backup signal generated from the parallel test circuit as an input and performs a NAND operation about them;
    a NAND gate latch which receives an output signal of the NAND gate and the parallel test signal as an input and generates a signal of "0" when the output signal of the NAND gate and the parallel test signal are "1"; and
    a buffer for buffering an output signal of the NAND gate latch.

4. The semiconductor memory test circuit according to claim 1, wherein:
    the test time reduction signal of the test mode circuit is activated when the battery backup signal is activated by an activated parallel test signal.

5. The semiconductor memory test circuit according to claim 1, wherein:
    the test time reduction signal of the test mode circuit is inactivated when the parallel test signal is inactivated under an inactivated battery backup signal.

6. A semiconductor memory test method comprising the steps of:
    performing a parallel test by generating a parallel test signal in response to a battery backup signal, a column address signal, a CAS before RAS signal, a write enable signal, a power-up bar signal, and a row address signal; and
    generating a test time reduction signal by a combination of the parallel test signal and the battery backup signal,
    wherein the test time reduction signal (ttrb) compresses one least significant bit indicating a row address of a device performing a 4K refresh operation in the case of 4K refresh operation, and compresses two least significant bits indicating a row address of a device performing an 8K refresh operation in the case of an 8K refresh operation.

7. The semiconductor memory test method according to claim 6, wherein:
    the test time reduction signal is activated when the battery backup signal is activated by an activated parallel test signal.

8. The semiconductor memory test method according to claim 6, wherein:
    the test time reduction signal is inactivated when the parallel test signal is inactivated by an inactivated battery backup signal.

9. The semiconductor memory test method according to claim 6, wherein:
    the test time reduction signal is enabled after a time of 128 us under the condition that the parallel test signal is activated.

10. A semiconductor memory test method comprising the steps of:
    performing a parallel test by generating a parallel test signal in response to a battery backup signal; and
    generating a test time reduction signal by a combination of the parallel test signal and the battery backup signal,
    wherein the test time reduction signal (ttrb) compresses one least significant bit indicating a row address of a device performing a 4K refresh operation in the case of 4K refresh operation, and compresses two least significant bits indicating a row address of a device performing an 8K refresh operation in the case of an 8K refresh operation.

11. The semiconductor memory test method according to claim 10, wherein the test time reduction signal is activated when the battery backup signal is activated by an activated parallel test signal.

12. The semiconductor memory test method according to claim 10, wherein the test time reduction signal is inactivated when the parallel test signal is activated by an inactivated parallel test signal.

13. The semiconductor memory test method according to claim 10, wherein the test time reduction signal is enabled after a time of 128 us under the condition that the parallel test signal is activated.

* * * * *